(12) United States Patent
Fukao et al.

(10) Patent No.: US 12,207,397 B2
(45) Date of Patent: Jan. 21, 2025

(54) STRETCHABLE CIRCUIT BOARD

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Takatoshi Abe, Osaka (JP); Kyosuke Michigami, Hyogo (JP); Makoto Takashiro, Osaka (JP); Susumu Fukushima, Shiga (JP); Daisuke Honda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 434 days.

(21) Appl. No.: 17/440,453

(22) PCT Filed: Mar. 26, 2020

(86) PCT No.: PCT/JP2020/013644
§ 371 (c)(1),
(2) Date: Sep. 17, 2021

(87) PCT Pub. No.: WO2020/196745
PCT Pub. Date: Oct. 1, 2020

(65) Prior Publication Data
US 2022/0167497 A1 May 26, 2022

(30) Foreign Application Priority Data
Mar. 27, 2019 (JP) .................. 2019-061651

(51) Int. Cl.
*H05K 1/02* (2006.01)
*H05K 1/11* (2006.01)

(52) U.S. Cl.
CPC ......... *H05K 1/0283* (2013.01); *H05K 1/0296* (2013.01); *H05K 1/118* (2013.01); *H05K 2201/09263* (2013.01)

(58) Field of Classification Search
CPC .... H05K 1/0283; H05K 1/0296; H05K 1/118; H05K 2201/09263
(Continued)

(56) References Cited

U.S. PATENT DOCUMENTS 8,207,473 B2 * 6/2012 Axisa ................... B32B 37/185
219/121.72
8,895,864 B2 * 11/2014 Cotton ................ H05K 1/0283
174/254

(Continued)

FOREIGN PATENT DOCUMENTS

CN 105826283 8/2016
CN 107432083 12/2017
(Continued)

OTHER PUBLICATIONS

Official Communication issued in International Bureau of WIPO Patent Application No. PCT/JP2020/013644, dated Jun. 16, 2020, along with an English translation thereof.

*Primary Examiner* — Anatoly Vortman
(74) *Attorney, Agent, or Firm* — GREENBLUM & BERNSTEIN, P.L.C.

(57) ABSTRACT

Provided is a stretchable circuit board including a stretchable insulating layer, and a wiring, in which the wiring is formed of a combination of a metal wiring portion that forms a main portion of the wiring, and a conductive stretchable portion disposed ancillary to the metal wiring portion.

7 Claims, 8 Drawing Sheets

(58) Field of Classification Search
USPC .......................................................... 174/254
See application file for complete search history.

(56)     References Cited

U.S. PATENT DOCUMENTS

| 9,706,647 | B2* | 7/2017 | Hsu ..................... H01L 23/5386 |
| 11,345,784 | B2* | 5/2022 | Michigami ........ C08G 59/4284 |
| 11,729,905 | B2* | 8/2023 | Hsu ..................... H05K 1/0283 |
| | | | 174/254 |
| 2009/0173529 | A1* | 7/2009 | Lee ..................... H05K 1/0283 |
| | | | 29/850 |
| 2010/0238636 | A1* | 9/2010 | Mascaro ................ H05K 3/143 |
| | | | 361/749 |
| 2012/0051005 | A1* | 3/2012 | Vanfleteren ............. H01L 24/81 |
| | | | 29/854 |
| 2013/0142963 | A1 | 6/2013 | Kirk et al. |
| 2013/0256004 | A1 | 10/2013 | Cotton et al. |
| 2014/0012106 | A1* | 1/2014 | Mascaro ................ H05K 3/143 |
| | | | 600/323 |
| 2014/0340857 | A1 | 11/2014 | Hsu et al. |
| 2016/0219696 | A1 | 7/2016 | Choi et al. |
| 2017/0181276 | A1 | 6/2017 | Sawada et al. |
| 2018/0070446 | A1 | 3/2018 | Takahashi et al. |
| 2021/0363308 | A1* | 11/2021 | Michigami .......... C08G 59/686 |

FOREIGN PATENT DOCUMENTS

| JP | 2013-187308 | 9/2013 |
| JP | 2015-506061 | 2/2015 |
| JP | 2015-178597 | 10/2015 |
| JP | 2017-118109 | 6/2017 |
| WO | 2010/086034 | 8/2010 |
| WO | 2016/114278 | 7/2016 |
| WO | 2018/123732 | 7/2018 |

* cited by examiner

STRETCHABLE CIRCUIT BOARD

TECHNICAL FIELD

The present invention relates to a stretchable circuit board.

BACKGROUND ART

A demand for higher wearability and higher shape followability has been increased with respect to devices and conductive materials used as various interfaces within the field of electronics (e.g., for devices such as sensors, displays, artificial skin for robots, and the like). There has been a demand for a flexible device that can be disposed on a curved surface, an uneven surface or the like, and is freely deformable according to the application.

A stretchable substrate used for such a flexible device has already been proposed, but in the stretchable substrate, however, there is a concern that wiring is broken due to contraction of the substrate.

In view of the above, there have been proposed techniques that can prevent such breakage of the wiring. In one technique, the shape of a wiring is formed into a wave form, and in another technique, a stretching amount limiting unit (dummy pattern) is provided for partially limiting a stretching amount of a stretchable substrate (Patent Literatures 1 and 2).

Further, there has been also proposed a stretchable wiring made of a conductive composition (paste) which is used in combination with a stretchable substrate (for example, Patent Literatures 3 to 5).

The curved wirings described in Patent Literatures 1 and 2 have a certain degree of resistance to bending. However, there is a concern that the wiring is broken when an elongation of the wiring exceeds 10%.

On the other hand, the stretchable conductive paste described in Patent Literatures 3 to 5 contains a binder resin. Accordingly, the conductivity of the wiring is not sufficient. Further, when the wiring is largely elongated or contracted, there is a concern that conductive resistance increases or a conduction failure occurs.

The present invention has been made in view of such circumstances, and it is an object of the present invention to provide a stretchable circuit board capable of suppressing breakage of a wiring caused by elongation or contraction of a wiring, an increase in conductive resistance caused by elongation or contraction of the wiring, and the occurrence of a conductive failure.

CITATION LIST

Patent Literature

Patent Literature 1: WO 2010/086034 A
Patent Literature 2: JP 2013-187308 A
Patent Literature 3: JP 2015-178597 A
Patent Literature 4: WO 2016/114278 A
Patent Literature 5: JP 2015-506061 A

SUMMARY OF INVENTION

As a result of intensive studies conducted by the inventors of the present invention, the inventors have found that the above problems can be solved by a stretchable circuit board having the following configuration, and have completed the present invention by further conducting studies based on such findings.

That is, according to one aspect of the present invention, there is provided a stretchable circuit board including
a stretchable insulating layer, and a wiring,
in which the wiring is formed of a combination of a metal wiring portion that forms a main portion of the wiring, and a conductive stretchable portion disposed ancillary to the metal wiring portion.

DESCRIPTION OF EMBODIMENTS

Figure 1:
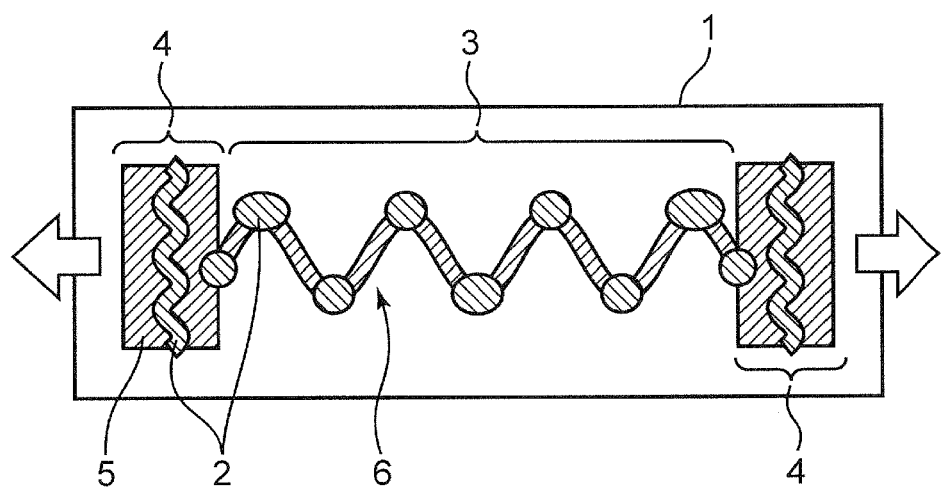
FIG. 1 is a schematic top plan view illustrating a configuration of a stretchable circuit board according to an embodiment of the present invention.

According to the present invention, it is possible to provide a stretchable circuit hoard capable of suppressing breakage of a wiring caused by elongation or contraction of a wiring, an increase in conductive resistance caused by elongation or contraction of a wiring, and the occurrence of a conductive failure.

Further, since the stretchable circuit board according to the present invention has the above-mentioned characteristics, the stretchable circuit board is applicable to various technical fields such as optics, electronics, adhesives, and in the medical field. The present invention is also applicable to IoT and a flexible display device. Accordingly, the stretchable circuit board of the present invention is extremely advantageous in industrial use.

Hereinafter, an embodiment according to the present invention will be specifically described. However, the present invention is not limited the embodiment. In the drawings appearing in the following description, reference numerals indicate the following portions: 1 indicates a stretchable insulating layer, 2 indicates a conductive stretchable portion, 3 indicates a wiring, 4 indicates a pad portion, 5 indicates a metal layer, and 6 indicates a metal wiring portion.
(Basic Configuration of Stretchable Circuit Board)

First, a basic configuration of a stretchable circuit board according to the present embodiment will be described. The stretchable circuit board according to the present embodiment includes a stretchable insulating layer 1 and a wiring 3 as exemplified in FIG. 1 as an example. As illustrated in FIG. 1, the wiring 3 is formed of a combination of: a metal wiring portion 6 that forms a main portion of the wiring 3; and conductive stretchable portions 2 disposed ancillary to the metal wiring portion 6. Specifically, the above-mentioned configuration means any one of: a configuration in which portions of the wiring 3 are each formed of the conductive stretchable portion 2 that is made of a conductive stretchable material, a configuration in which portions of the wiring 3 are each reinforced by the conductive stretchable portion 2; or a configuration which is formed of both of the above-mentioned two configurations.

With such a configuration, it is considered that, even in a case where the substrate is elongated in a direction indicated by an arrow illustrated in FIG. 1, since the portions of the wiring 3 are each formed of the conductive stretchable portion 2 and/or are each reinforced by the conductive stretchable portion 2, the wiring formed of metal or the like having poor elongation property is not broken and hence, it is possible to suppress an increase in conductive resistance and the occurrence of a conductive failure caused by elongation or contraction of the wiring.

In FIG. 1, regions having a maximum amplitude and regions having a minimum amplitude of the wiring having a wave shape are each formed of the conductive stretchable portion 2. Further, pad portions 4 are disposed at both ends of the wiring 3, and a portion of each pad portion 4 is formed of the conductive stretchable portion 2 having a wave shape.

Figure 2:
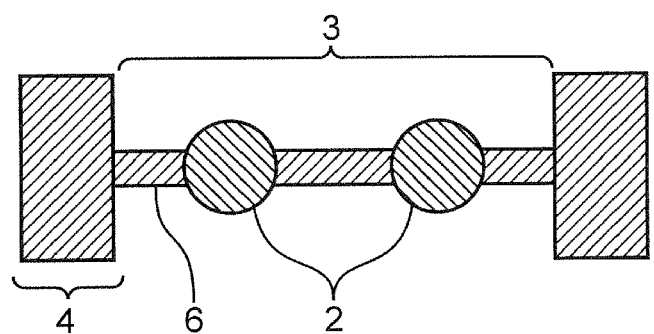
FIG. 2 is a schematic top plan view illustrating a shape of a wiring on the stretchable circuit board according to the embodiment of the present invention.
Figure 3:
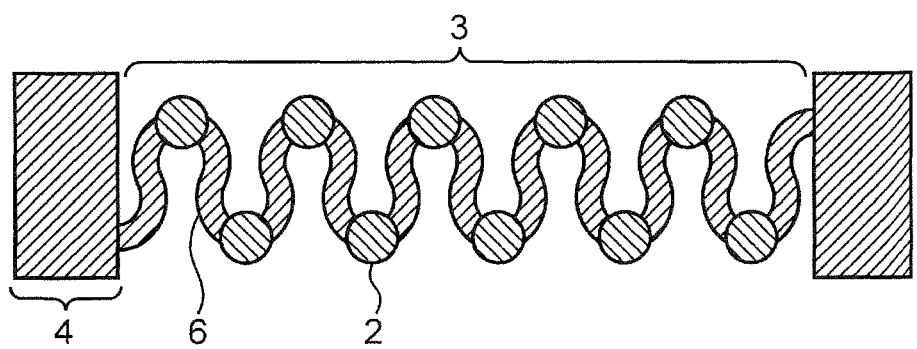
FIG. 3 is a schematic top plan view illustrating a shape of a wiring on a stretchable circuit board according to another embodiment of the present invention.

The shape of the wiring 3 is not limited to a wave shape. For example, bridging portions each formed of the conductive stretchable portion 2 may be disposed on the wiring 3 having a straight line shape as illustrated in FIG. 2. Alternatively, the wiring 3 may be formed of a meander wiring as illustrated in FIG. 3. Regions of the meander wiring having a maximum amplitude and regions of the meander wiring having a minimum amplitude may be bridging portions each formed of the conductive stretchable portion 2. Preferably, it is desirable to provide the bridging portions each formed of the conductive stretchable portion 2 at portions of the wiring where a breakage is likely to occur, that is, portions of the wiring which are weak against elongation of the wiring when the substrate is elongated or contracted. With such a configuration, compared with a case where the wiring has a straight line shape or a case where the conductive stretchable portions are not provided to the wiring, the structure of the circuit board itself is elongated before the conductive compositions are elongated, and the elongation of the conductive compositions starts for the first time when the elongation of the structure of the circuit board is finished. Accordingly, the stretchable circuit board according to the present embodiment has an advantage that an increase in resistance with respect to an elongation rate is suppressed.

Figure 7:
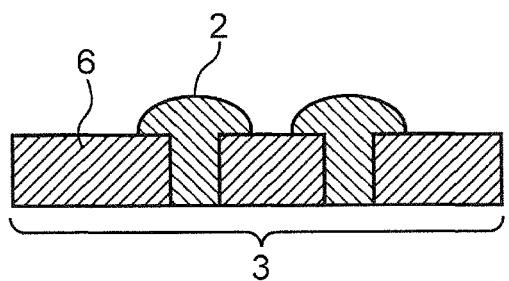
FIGS. 7(A) and 7(B) are schematic cross-sectional view illustrating an example of a form of a conductive stretchable portion on the stretchable circuit board of the present invention.
Figure 7:
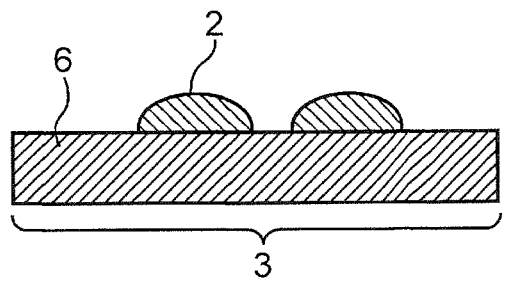

In FIG. 7(A) which is the cross-sectional view, a configuration is adopted in which a metal wiring portion 6 is disconnected, and a conductive stretchable portion 2 fills each space between disconnected portions of the metal wiring portion 6. That is, FIG. 7(A) illustrates the configuration in which portions of the wiring 3 are each formed of the conductive stretchable portion 2. However, the circuit board according to the present embodiment is not limited to the above-mentioned configuration. For example, as illustrated in FIG. 7(B), a metal wiring portion 6 may not be disconnected, and conductive stretchable portions 2 may be formed on a surface of the metal wiring portion 6 so as to reinforce portions of the wiring 3. As illustrated in FIG. 7(A), when the metal wiring portion 6 is disconnected, the conductive stretchable portion 2 may or may not expand larger than a disconnection width on the surface of the metal wiring portion 6.

Figure 8:
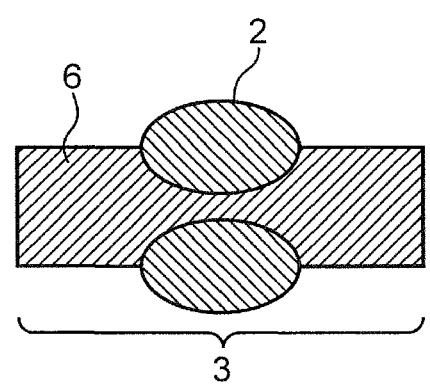
FIG. 8 is a schematic back view illustrating an example of a form of a metal layer and a conductive stretchable portion on the stretchable circuit board of the present invention.

FIG. 8 is a view of a wiring 3 as viewed from a back side. FIG. 8 is a plan view of the wiring 3 in a case where a metal wiring portion 6 is not disconnected, and conductive stretchable portions 2 are formed on a surface of the metal wiring portion 6 so as to reinforce portions of the wiring 3. For example, as illustrated in FIG. 8, the case is described where a portion of the metal wiring portion 6 forms a narrow neck portion, and at least a portion of the neck portion bridges the conductive stretchable portions 2. With such a configuration, it is possible to suppress breakage (loss of conduction) on the wiring against in-plane bending of the stretchable circuit board. Such a configuration is also included in the concept of providing a bridging portion formed of the conductive stretchable portion 2 at a portion where breakage is likely to occur on the wiring, that is, a portion which is weak against elongation, for the purpose of coping with not only the elongation and contraction of the substrate but also the in-plane bending of the substrate.

(Modification of Stretchable Circuit Board)

Next, some modifications of the stretchable circuit board according to the present embodiment will be described with reference to the drawings, but the present embodiment is not limited to these modifications.

Figure 4:
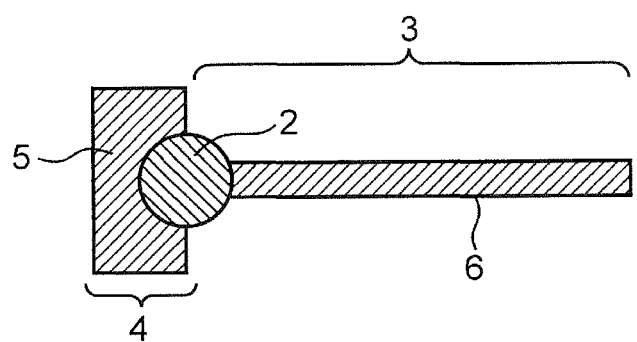
FIG. 4 is a schematic top plan view illustrating a connection portion between a wiring and a pad portion on a stretchable circuit board according to still another embodiment of the present invention.

As illustrated in FIG. 4, the stretchable circuit board according to one embodiment may further include a pad portion 4 formed of a metal layer 5 which constitutes a main portion in addition to the basic configuration as described above. In this case, the stretchable circuit board includes a wiring 3 (right side) and the pad portion 4 (left side). It is often the case that breakage (also conduction failure caused by the breakage) occurs at a connection portion between the pad portion 4 and a metal wiring portion 6 that forms the wiring 3. Accordingly, it is preferable that the configuration be adopted in which the connection portion between the metal wiring portion 6 and the pad portion 4 is formed of the conductive stretchable portion 2 as illustrated in FIG. 4. It is also preferable that the configuration be adopted in which the connection portion is reinforced by the conductive stretchable portion 2. It is also preferable that both of the above configurations be adopted. In these cases, the connection portion between the wiring 3 and the pad portion 4 is formed of the conductive stretchable portion 2 disposed ancillary to the connection portion.

Figure 5:
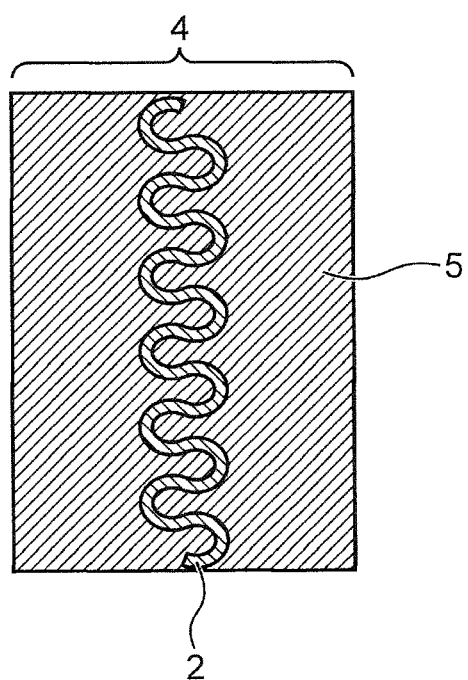
FIG. 5 is a schematic top plan view illustrating an example of a configuration of a pad portion on the stretchable circuit board of the present invention.

Further, a case is also considered where a defect such as a split or a crack occurs in the metal layer 5 at the pad portion 4 formed of the metal layer 5 when the stretchable circuit board is elongated or contracted. In view of the above, as illustrated in FIG. 5 (an enlarged view of the pad portion 4), the configuration may be adopted in which a portion of the metal layer 5 which forms the pad portion 4 is formed of the conductive stretchable portion 2. Alternatively, the configuration may be adopted in which a portion of the metal layer 5 which forms the pad portion 4 is reinforced by the conductive stretchable portion 2. The configuration may also be adopted in which both of the above-mentioned configurations are used. In this case, the pad portion 4 is formed of: the metal layer 5 which forms the main portion of the pad portion 4; and the conductive stretchable portion 2 disposed ancillary to the metal layer 5.

Figure 6:
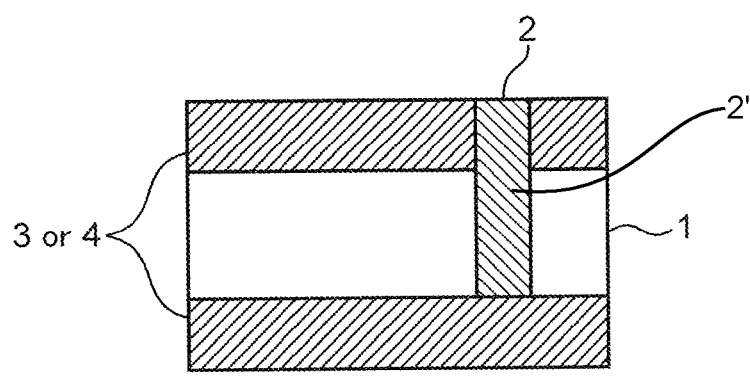
FIG. 6 is a schematic cross-sectional view of a stretchable circuit board according to still another embodiment of the present invention.

Furthermore, in the stretchable circuit board described above, the wiring 3 and the pad portion 4 may be disposed not only on one side of the stretchable insulating layer 1 but also on both sides of the stretchable insulating layer 1. In that case, as illustrated in FIG. 6 which is the cross-sectional view, the wiring 3 or the pad portion 4 formed on one surface of the stretchable insulating layer 1 and the wiring 3 or the pad portion 4 formed on the other surface may be bridged by the conductive stretchable portion 2. As a result, it is possible to obtain an advantage that the bridging portion 2' can be used in a double-sided circuit board without being broken during elongation and contraction. It is not always necessary that the conductive stretchable portion 2 penetrate the wiring 3. For example, as illustrated in FIG. 6, the conductive stretchable portion 2 may penetrate the wiring 3 or the pad portion 4 on one side and may not penetrate the wiring 3 or the pad portion 4 on the opposite side.

Materials of respective constitutional elements (the stretchable insulating layer, the metal wiring portion, the metal layer, and the conductive stretchable portion) of the stretchable circuit board according to the present embodiment are not particularly limited. However, for example, materials described below can be used.

(Stretchable Insulating Layer)

The stretchable insulating layer according to the present embodiment is not particularly limited as long as the stretchable insulating layer is an insulating layer having stretchability.

The insulating layer according to the present embodiment may be or may not be transparent. However, the insulating layer more preferably has transparency with a total light transmissivity of 70% or more. In a case where a resin composition or an epoxy resin composition which contains a polyrotaxane described later is used as a constituent material of the insulating layer, the above-mentioned transparency can be obtained by selecting an epoxy resin or a curing agent for the epoxy resin.

Further, in the circuit board according to the present embodiment, a thickness of the insulating layer is not particularly limited. However, for example, it is preferable that the thickness of the insulating layer fall within a range of 10 μm to 200 μm from a viewpoint of handling property, optical characteristics, and wearability.

Furthermore, the insulating layer that the circuit board according to the present embodiment includes is preferably an insulating layer that is elastically deformable and has little residual strain, and has a stress relaxation property. Specifically, the insulating layer is preferably an insulating layer formed of a resin composition that is elastically deformable and has little residual strain, and has a stress relaxation property in a state of being a cured product.

In the present embodiment, the description "elastically deformable and has little residual strain" more specifically means that there is no plastic deformation and preferably the residual strain is 3% or less. The description "has a stress relaxation property" means that a constituent element has a property of reducing an applied stress so that a residual stress becomes small when a force (for example, a tensile force or the like) is applied.

In the present embodiment, for the sake of convenience, a residual strain and a stress relaxation property of the resin composition are defined by a stress relaxation rate R and a residual strain rate α measured by an elongation-restoration test described later.

Preferably, the resin composition according to the present embodiment is a resin composition having the stress relaxation rate R of 20 to 95% and the residual strain rate α of 0 to 3% in a state of being a cured product. More preferably, the resin composition according to the present embodiment is a resin composition having a stress relaxation rate R of 30 to 60% and the residual strain rate α of 0 to 1.5%.

It is considered that the insulating layer that uses the resin composition exhibiting a stress relaxation rate and a residual strain rate in such ranges simultaneously possesses stretchability, high stress relaxation when a tensile force is applied, and excellent restorability after elongation in combination and hence, the insulating layer is hardly broken, whereby the insulating layer possesses excellent reliability.

[Elongation-Restoration Test]

In the elongation-restoration test used in the present embodiment, a cured product piece of a resin composition (thickness: 50 μm, sample shape: dumbbell No. 6 (width of measured portion: 4 mm, length of parallel portion: 25 mm)) is subjected to an elongation process and then to a restoration process under the following conditions using a tension-compression testing machine (for example, Autograph (model: AGS-X) manufactured by Shimadzu Corporation) in accordance with ISO 3384. Then, a stress relaxation rate R and a residual strain rate α are calculated by the following calculation method.

(Elongation Process Conditions)

In order to remove the deflection which occurs when the test piece is attached to a gripper, the deflection correction is performed with a force of 0.05 N or less.

Test speed: 25 mm/min up to elongation of 0 to 25%

Temperature condition: 23° C.

Elongation and holding conditions: elongation of 25% and holding time of 5 minutes (Restoration Process Conditions)

Test speed: 0.1 mm/min until a tensile force becomes 0±0.05 N

Temperature condition: 23° C.

In a stress relaxation rate calculation method, a tensile force at the end of the elongation process is measured, and the measured tensile force is defined as an initial tensile force $F_{A0}$. Then, an amount of strain is maintained under the above-mentioned elongation and holding conditions, and a tensile force is measured after a lapse of 5 minutes. The measured tensile force is set as $F_A(t_5)$. The stress relaxation rate R is calculated by the following formula.

$$R = \frac{F_{AO} - F_A(t5)}{F_{AO}} \times 100 \qquad \text{[Formula 1]}$$

In the residual strain rate calculation method, in the restoration process, an amount of strain is measured at a point of time that the tensile force becomes 0±0.05 N, and the measured amount of strain is defined as a residual strain α.

As a further preferred embodiment, it is desirable that the resin composition be a resin composition in which a stress value measured at the time of maximum elongation (at 25% elongation) becomes a maximum stress value in the elongation-restoration test. By adopting such a resin composition, a yield phenomenon of the material does not occur and hence, the resin composition can acquire higher restorability.

Further, the resin composition according to the present embodiment is preferably a resin composition that satisfies the above-mentioned respective relationships even when the elongation process and the restoration process are repeated two or more times in the elongation-restoration test. By adopting such a resin composition, it is possible to obtain a resin composition that is more excellent in restorability and does not lose a restoring force even after elongation of the resin composition is performed a plurality of times. Such a resin composition is considered to exhibit further excellent bending resistance and other properties in a flexible display device and the like, for example.

It is desirable that the resin composition according to the present embodiment further be a resin composition where a tensile force $F_{B0}$ immediately after finishing the elongation process and a tensile force $F_B(t_{30})$ 30 minutes after finishing the elongation process satisfy the following formula:

$$0.1 \leq (F_B(t_{30})/F_{B0}) \leq 0.7$$

when measurement is started at the same time as the end of the elongation process in the following stress relaxation property test.

With the use of the resin composition having such characteristics, it is possible to obtain a resin insulating layer having more excellent stress relaxation property. Accordingly, such a resin composition is extremely useful.

[Stress Relaxation Property Test]

Using a cured product piece of the resin composition (thickness: 50 μm, sample shape: dumbbell No. 6 (width of measured portion: 4 mm, length of parallel portion: 25 mm)), an elongation process is performed under the following conditions using a tension-compression testing machine in accordance with ISO 3384, a tensile force at the end of elongation is measured, and the measured tensile force is defined as an initial tensile force $F_{B0}$. Then, after a lapse of 30 minutes, the tensile force $F_B(t_{30})$ is measured.

(Elongation Process Conditions)

Deflection correction is performed to remove the deflection which occurs in the test piece when the test piece is attached to the gripper. Deflection correction is performed with a force of 0.05 N or less.

Test speed: 25 mm/min up to elongation of 50%

Temperature condition: 23° C.

Elongation and holding conditions: elongation of 50% and holding time of 30 minutes It is preferable that the resin composition used in the present embodiment, also in the above-mentioned stress relaxation property test, satisfy the above-mentioned respective relationships even when elongation and holding are repeated two or more times (that is, even when the measurement is performed repeatedly using the sample restored to an original state under an arbitrary condition after finishing the first test).

As long as the resin composition used in the insulating layer according to the present embodiment has the characteristics described above, the composition thereof is not particularly limited.

Preferably, the resin composition according to the present embodiment contains at least a thermosetting resin and a curing agent for the thermosetting resin. An epoxy resin is preferably exemplified as the thermosetting resin.

One of more specific embodiments of the resin composition includes, for example, a resin composition that contains a polyrotaxane (A), a thermosetting resin (B), and a curing agent (C). Hereinafter, respective components will be described more specifically.

Specific examples of the polyrotaxane (A) include polyrotaxanes described in, for example, JP 4482633 B2 or WO 2015/052853 A. A commercially available product may be used, and specifically, a SeRM Super Polymer A1000 manufactured by Advanced Softmaterials Inc. or the like can be used.

Next, examples of the thermosetting resin (B) include a thermosetting resin such as an epoxy resin, a phenol resin, a polyimide resin, a urea resin, a melamine resin, an unsaturated polyester, and a urethane resin, although the thermosetting resin (B) is not particularly limited to these resins. Among these resins, however, an epoxy resin is preferably used.

Specific examples of the epoxy resin include a bisphenol A epoxy resin, a bisphenol F epoxy resin, a bisphenol S epoxy resin, an aralkyl epoxy resin, a phenol novolac epoxy resin, an alkylphenol novolac epoxy resin, a biphenol epoxy resin, a naphthalene epoxy resin, a dicyclopentadiene epoxy resin, an epoxidized product of a condensate of a phenol and an aromatic aldehyde having a phenolic hydroxyl group, triglycidyl isocyanurate, and an alicyclic epoxy resin. These epoxy resins may be used such that one kind of epoxy resin is used alone or two or more kinds of epoxy resins are used in combination depending on the situation.

The epoxy resin is more preferably, for example, an epoxy resin containing two or more epoxy groups in one molecule and having a molecular weight of 500 or more. As such an epoxy resin, a commercially available epoxy resin may be used, and examples thereof include JER1003 (manufactured by Mitsubishi Chemical Corporation, molecular weight: 1300, bifunctional), EXA-4816 (manufactured by DIC Corporation, molecular weight: 824, bifunctional), and YP50 (manufactured by Nippon Steel Sumitomo Metal Chemical Co., Ltd., molecular weight: 60000 to 80000, bifunctional).

As another example of the epoxy resin, an epoxy resin contains a thermosetting resin (B) and a curing agent (C), wherein the thermosetting resin (B) is an epoxy resin which includes an alkylene oxide-modified group having 2 to 3 carbon atoms, 4 mol or more of the modified group are contained in 1 mol of epoxy molecule, the epoxy resin includes an epoxy group of 2 mol or more, and an epoxy equivalent is 450 eq/mol or more. By curing such a product, it is possible to obtain a resin composition having the stretchability and the tensile elastic modulus. Specific examples of such an epoxy resin include a propylene oxide addition type bisphenol A type epoxy resin (EP4003S manufactured by ADEKA Corporation), and an ethylene oxide addition type hydroxyphenyl fluorene type epoxy resin (EG-280 manufactured by Osaka Gas Chemicals Co., Ltd.).

The resin composition which contains a single component selected from either the polyrotaxane (A) or the thermosetting resin (B) and the curing agent (C) may be used. However, from a viewpoint that the resin composition having the stretchability and the tensile elastic modulus can be easily obtained using a cured product of the resin composition which contains both components ((A) and (B)) and the curing agent (C), the resin composition which contains both components ((A) and (B)) and the curing agent (C) is desirable. With respect to the epoxy resins described above, one kind of epoxy resin may be used alone, or two or more kinds of epoxy resins may be used in combination.

The curing agent (C) is not particularly limited as long as the curing agent (C) acts as a curing agent for the thermosetting resin (B). In particular, examples of curing agents that can be preferably used as a curing agent for an epoxy resin include a phenol resin, an amine-based compound, an acid anhydride, an imidazole-based compound, a sulfide resin, and a dicyandiamide. Further, a light/ultraviolet curing agent, a thermal cation curing agent and the like can also be used. These epoxy resins may be used such that one kind of epoxy resin is used alone or two or more kinds of epoxy resins are used in combination depending on the situation. The resin composition may contain a curing accelerator when necessary. Examples of the curing accelerator include imidazole-based compounds.

In a case where the resin composition according to the present embodiment is a resin composition which contains polyrotaxane, the resin composition may further contain a crosslinking agent. The crosslinking agent is not particularly limited as long as the crosslinking agent can form a structure crosslinked with at least a portion of a cyclic molecule of polyrotaxane (at least one reactive group of a cyclic molecule of polyrotaxane). Specific examples of the crosslinking agent include isocyanate and cyanuric chloride.

The proportion of the respective components in the resin composition is not particularly limited as long as the fiber sheet can acquire advantageous effects of the present invention. However, for example, in a case where the resin composition contains all of the component (A), the component (B), and the component (C), assuming a total amount of the component (A), the component (B), and the component (C) as 100 parts by mass, amounts of the respective components become as follows. The amount of polyrotaxane (A) is about 10 to 80 parts by mass, and more preferably about 30 to 50 parts by mass. The amount of the thermosetting resin (B) is 10 to 89.9 parts by mass, and more preferably 30 to 50 parts by mass. The amount of the curing agent (C) is about 0.1 to 30 parts by mass, more preferably about 0.1 to 20 parts by mass. In a case where the resin composition according to the present embodiment contains an isocyanate resin as a crosslinking agent, 0 to 50 parts by mass of the isocyanate resin can be added to polyrotaxane (A). More preferably, 10 to 40 parts by mass of the isocyanate resin is added to polyrotaxane (A). In a case where the resin composition contains the component (B) and the component (C) and does not contain the component (A), assuming a total amount of the resin composition as 100 parts by mass, an amount of the thermosetting resin (B) is about 50 to 99 parts by mass, more preferably about 60 to 80 parts by mass, and an amount of the curing agent (C) is about 1 to 50 parts by mass, more preferably about 1 to 40 parts by mass.

Furthermore, the resin composition according to the present embodiment may contain other additives, for example, a curing catalyst (curing accelerator), a flame retardant, a flame retardant aid, a leveling agent, a coloring agent, and the like when necessary as long as the advantageous effects of the present invention are not impaired.

A method for preparing the resin composition according to the present embodiment is not particularly limited. For example, the resin composition according to the present embodiment can be obtained by firstly mixing an epoxy resin, a curing agent, a crosslinking agent, a thermosetting resin, and a solvent such that these compositions are uniformly mixed. The solvent used in preparing the resin composition is not particularly limited. For example, toluene, xylene, methyl ethyl ketone, acetone, and the like can be used. With respects to these solvents, one solvent may be used alone or two or more kinds of solvents can be used in combination. If necessary, an organic solvent for adjusting the viscosity or various additives may be blended.

By curing the resin composition obtained as described above while evaporating a solvent in the resin composition by heating and drying the resin composition, the insulating layer can be obtained.

With respect to a method, a device, and conditions for heating and drying the resin composition, various means similar to the conventional means or means which are obtained by improving the conventional means may be used. The specific heating temperature and the specific heating time can be appropriately set depending on a crosslinking agent, a solvent, and the like to be used. For example, the resin composition can be cured by heating and drying at a temperature of 50 to 200° C. for about 60 to 180 minutes.

A surface treatment may be applied to one surface of the insulating layer (a molded body which is a cured product of the resin composition or the like) obtained as described above in order to stably form a wiring (conductive layer) on the surface. Further, various additives such as an antioxidant, a weathering stabilizer, a flame retardant, an antistatic agent and the like can be added as long as the properties of the resin composition are not impaired.

(Metal Wiring Portion and Metal Layer)

In the present embodiment, in forming the metal wiring portion and the metal layer, various kinds of metal foils, metal ink, sputtering and the like which are used for forming a wiring, pad portions and the like on a general circuit board can be used without particular limitation.

The metal foil is not particularly limited, and examples thereof include a copper foil (plating) and an aluminum foil. These metal foils may be metal foils to which surface treatment is applied using a silane coupling agent or the like.

In forming a wiring, a pad portion or the like using such a metal foil, one or a plurality of stretchable insulating layers described above are laminated, and a metal foil such as a copper foil is further laminated to both upper and lower surfaces or one surface of the laminated stretchable insulating layers, and the laminated layers are integrally stacked by heat press molding. As a result, a double-sided metal foil-clad stacked body or a single-sided metal foil-clad stacked body can be prepared. Then, a circuit (wiring) is formed by applying etching or the like to the metal foil. As a result, a conductor layer (wiring, pads and the like) can be disposed as a circuit on the surface of the stretchable insulating layer according to the present embodiment. Examples of a method for forming a circuit include, in addition to the above-mentioned circuit forming method, a semi-additive process (SAP) or a modified semi-additive process (MSAP).

(Conductive Stretchable Portion)

Any member which has both conductivity and stretchability can be used as the conductive stretchable portion according to the present embodiment without particular limitation. For example, the conductive stretchable portion according to the present embodiment may be formed of a conductive composition having stretchability. For example, the conductive stretchable portion according to the present embodiment can be formed using a conductive paste which contains the resin composition having stretchability when formed into a cured product as a binder. Liquid metal can be used for forming the conductive stretchable portion.

The conductive stretchable portion according to the present embodiment has further technical features that a Tg or a softening point of the conductive stretchable portion is 40° C. or lower, or an elastic modulus of the conductive stretchable portion at a temperature of 30° C. is less than 1.0 GPa.

When the Tg or the softening point of the conductive stretchable portion exceeds 40° C., the elastic modulus around a room temperature increases so that the flexibility of the conductive stretchable portion at a normal temperature decreases. The lower limit value of the Tg or the softening point of the conductive stretchable portion is not particularly limited, and the lower the Tg or the softening point, the higher the flexibility and stretchability at room temperature becomes. However, when the Tg or the softening point of the conductive stretchable portion is lower than −40° C., stickiness such as tacking is likely to occur. Accordingly, the Tg or the softening point of the conductive stretchable portion is preferably −40° C. or higher, and is more preferably −30° C. or higher.

Alternatively, when the elastic modulus of the conductive stretchable portion at 30° C. is 1.0 GPa or more, an internal stress in the conductive stretchable portion at the time of elongation or contraction or at the time of deformation increases. Accordingly, when the conductive composition is used for forming the conductive stretchable portion, breakage of the conductive filler or breakage at an interface between the conductive filler and the resin are likely to be induced, and there is a concern that such a phenomenon lowers conductivity of the conductive stretchable portion when the conductive stretchable portion expands or contracts. The lower limit value of the elastic modulus of the conductive stretchable portion at 30° C. is also not particularly limited. However, the elastic modulus is preferably 100 kPa or more, and is more preferably 500 kPa or more from a viewpoint of restorability of the shape.

Hereinafter, an example of the stretchable conductive composition that can be used for the stretchable circuit board according to the present embodiment will be specifically illustrated.

Specific examples of the conductive composition include the following resin composition. The resin composition contains: a resin (D) that becomes a stretchable binder; a curing agent (E) that reacts with the resin (D); and a conductive filler (F). The resin (D) has a functional group having a functional group equivalent of 400 g/eq or more and 10,000 g/eq or less. A cured product of the resin (D) and the conductive composition has a glass transition temperature (Tg) or a softening point of 40° C. or less, and has an elastic modulus of less than 1.0 GPa at a temperature of 30° C. The conductive filler (F) is formed of a conductive substance having an intrinsic volume resistivity of $1\times10^{-4}$ $\Omega\cdot$cm or less at a room temperature. Examples of the functional group include an epoxy group, a vinyl group, a (meth) acryloyl group, a hydroxyl group, a carboxyl group, an amino group, an alkoxy group, and a carbonyl group.

The respective components will be described hereinafter.

With respect to the constituent elements of the molecular structure of the resin (D), the molecular structure may be formed of a single constituent element, or may be formed of plural kinds of constituent elements contained in combination at an arbitrary ratio. The molecular structure of the resin (D) is preferably a molecular structure containing at least one selected from a group consisting of (meth) acrylic acid ester, styrene, and nitrile as a constituent element. As specific examples, epoxy-modified (meth) acrylic acid ester, hydroxyl group-modified (meth) acrylic acid ester, carboxyl group-modified (meth) acrylic acid ester, and the like are preferably exemplified.

According to the present embodiment, the resin (D) preferably has a weight average molecular weight of 50,000 or more. Accordingly, it is considered that in a case where a conductive pattern is printed using the conductive composition according to the present embodiment or the like, it is considered that blurring in printing hardly occurs. On the other hand, an upper limit value of the weight average molecular weight is not particularly limited. However, in a case where the molecular weight exceeds 3 million, the viscosity is increased so that the handling property may be deteriorated. Accordingly, the weight average molecular weight range of the resin (D) is preferably 50,000 or more and 3 million or less, and more preferably 100,000 or more and 1 million or less.

As the curing agent (E), various curing agents can be used without particular limitation as long as the curing agent (E) has reactivity with the resin (D) as described above. Specific examples of the curing agent (E) include radical generators such as imidazole-based compounds, amine-based compounds, phenol-based compounds, acid anhydride-based compounds, isocyanate-based compounds, mercapto-based compounds, onium salts, and peroxides, and photoacid generators.

The conductive filler (F) is made of a conductive material having an intrinsic volume resistivity of $1\times10^{-4}$ $\Omega\cdot$cm or less at a room temperature. In a case where a material having an intrinsic volume resistivity of more than $1\times10^{-4}$ $\Omega\cdot$cm at a room temperature is used, the volume resistivity of the conductive composition is about $1\times10^{-3}$ $\Omega\cdot$cm to $1\times10^{-2}$ $\Omega\cdot$cm although it depends on a blending amount when the conductive composition is produced. Therefore, when a circuit is formed using the conductive composition, a resistance value of the circuit is increased so that a loss of power is increased.

Examples of the conductive material (the conductive material having an intrinsic volume resistivity of $1\times10^{-4}$ $\Omega\cdot$cm or less at a room temperature) include a single component formed of a metal element such as silver, copper or gold, and compounds such as oxides, nitrides, carbides, and alloys containing these elements. In addition to the conductive filler (F), a conductive or semiconductive conductive auxiliary agent can be added to the conductive composition for the purpose of further improving conductivity. As such a conductive or semiconductive auxiliary agent, a conductive polymer, an ionic liquid, carbon black, acetylene black, a carbon nanotube, an inorganic compound used for an antistatic agent, and the like can be used. One kind of auxiliary agent may be used, or two or more kinds of auxiliary agents may be simultaneously used.

The shape of the conductive filler (F) is preferably a flat shape, and an aspect ratio between a thickness and a size in an in-plane longitudinal direction is preferably 10 or more. When the aspect ratio is 10 or more, it is also possible to acquire an advantageous effect that not only a surface area with respect to a mass ratio of the conductive filler increases and the conductivity efficiency increases, but also the adhesion of the conductive filler with the resin component is improved so that the stretchability of the fiber sheet is improved. From a viewpoint that better conductivity and printability can be secured when the aspect ratio is 1000 or less, the aspect ratio is preferably 10 or more and 1000 or less, and is more preferably 20 or more and 500 or less. Examples of the conductive filler having such an aspect ratio include a conductive filler having a tapped density of 6.0 g/cm³ or less as measured by a tap method. Furthermore, when the tapped density is 2.0 g/cm³ or less, the aspect ratio is further increased. Accordingly, such tapped density is more preferable.

With respect to a proportion of the conductive filler (F) in the conductive composition, in terms of conductivity, cost, and printability, the proportion of the conductive filler (F) is preferably 40 to 95% by mass, and is more preferably 60 to 85% by mass with respect to a total amount of the conductive composition.

A particle size of the conductive filler (F) of the present embodiment is not particularly limited. However, from a viewpoint that proper printing property is obtained during screen printing and proper viscosity is obtained in mixing of blending materials, an average particle size (a particle size at volume accumulation of 50%; D50) measured by a laser light scattering method is preferably 0.5 µm or more and 30 µm or less, and is more preferably 1.5 µm or more and 20 µm or less.

Furthermore, according to the present embodiment, the conductive filler (F) is preferably a conductive filler whose surface is subjected to a coupling treatment. Alternatively, the resin composition according to the present embodiment may contain a coupling agent. With such configurations, an advantageous effect is acquired that the adhesion between the binder resin and the conductive filler is further improved.

The coupling agent which is added to the conductive composition or is used for applying coupling treatment to the conductive filler can be used without particular limitation as long as the coupling agent is adsorbed in the filler surface or reacts with the filler surface. Specific examples of the coupling agent include a silane coupling agent, a titanate-based coupling agent, and an aluminum-based coupling agent.

In a case where a coupling agent is used in the present embodiment, an addition amount of the coupling agent is preferably about 1% by mass to 20% by mass with respect to the entirety of the conductive composition.

Proportions

The proportions of respective components in the conductive composition are not particularly limited as long as the fiber sheet can exhibit advantageous effects of the present invention. The proportions of the resin (F) and the curing agent (G) can be appropriately determined in consideration of an equivalent ratio or the like depending on a kind of the resin and a kind of the curing agent.

In addition to the above components, additives or the like can be added to the conductive composition according to the purpose. Examples of the additives include elastomers, surfactants, dispersants, colorants, fragrances, plasticizers, pH adjusters, viscosity adjusters, ultraviolet absorbers, antioxidants, and lubricants.

The method for preparing the conductive composition is not particularly limited as long as the conductive composition can be produced. Examples of the method for preparing the conductive composition include a method of obtaining the conductive composition by uniformly mixing and stirring the resin component and the conductive filler described above, and when necessary, a curing agent, a dispersant and the like, and a solvent. The mixing and stirring method is not particularly limited. A highly shearing and dispersing device such as a rotation-revolution mixer or a three-roll mill is preferably used. Further, vacuum degassing may be performed.

In the present embodiment, as liquid metal, for example, an alloy of gallium, indium or tin which is in a liquid form at a normal temperature is used. An inorganic filler or the like may be added to the liquid metal for viscosity adjustment from the viewpoint of holding the shape.

Forming of Conductive Stretchable Portion (Bridging Portion) Using Conductive Composition or Liquid Metal By applying or printing the conductive composition or liquid metal according to the present embodiment on the stretchable insulating layer, the metal wiring portion or the metal layer described above, a coating film made of the conductive composition can be formed so that the conductive stretchable portion (bridging portion) is formed at a desired portion.

Specifically, the bridging portion or the like can be formed on the stretchable insulating layer, the metal wiring portion or the metal layer by the following steps. That is, first, the coating film is formed by applying or printing the conductive composition or the liquid metal of the present embodiment on the stretchable insulating layer, the metal wiring portion or the metal layer described above, and a volatile component contained in the coating film is removed by drying. The conductive stretchable portion (bridging portion) can be formed by performing: a step of curing the resin (D) and the curing agent (F) by a subsequent curing step such as heating or the irradiation of electron beams or light; and a step of generating a reaction between the coupling agent and the conductive filler (F) and a reaction between the resin (D) and the curing agent (F). The conditions in the curing step and the reaction step are not particularly limited, and may be appropriately set according to the type or desired form of the resin, the curing agent, the filler, and the like.

The step of applying the conductive composition of the present embodiment is not particularly limited. However, for example, a coating method which uses an applicator, a wire bar, a comma roll or a gravure roll, or a printing method which uses a screen, a flat plate offset, a flexo, an inkjet, stamping, a dispenser, a squeegee, or the like can be used.

The conductive stretchable portion may be formed in the insulating layer as described above. In this case, for example, as illustrated in FIG. 6, a hole is formed using a drill or a laser, and the conductive composition or the liquid metal can be poured into the hole. A passage penetrating from an outer surface of the copper on one side of the double-sided plate to an outer surface of the copper on an opposite side of the double-sided plate may be filled with the conductive composition. Alternatively, a passage from the outer surface of the copper on one side of the double-sided plate to an inner surface of the copper on an opposite side of the double-sided plate may be filled with the conductive composition. With such a process, the conductive stretchable portion can be formed in the insulating layer.

The stretchable circuit board according to the present embodiment is particularly excellent in flexibility, stress relaxation property and restorability, and has both stretchability and bendability. Accordingly, the stretchable circuit board according to the present embodiment is extremely suitable as an electronic material used for, for example, a bendable electronic paper, an organic EL display, a solar cell, an RFID, a pressure sensor, and the like. Further, the stretchable circuit board according to the present embodiment can suppress breakage of a wiring caused by elongation or contraction of the wiring, an increase in conductive resistance associated with elongation or contraction of the wiring, and the occurrence of a conductive failure. Accordingly, the stretchable circuit board according to the present embodiment is extremely useful for industrial use.

This application is based on Japanese Patent Application No. 2019-61651 filed on Mar. 27, 2019, the contents of which are included in the present application.

In order to express the present invention, the present invention has been appropriately and sufficiently described through the embodiments with reference to specific examples, drawings, and the like in the above. However, it should be recognized that a person skilled in the art can easily change and/or improve the above-described embodiments. If a change or improvement made by a person skilled in the art is not at a level departing from the scope of rights of the claims described in the claims, such change or improvement is considered to be included in the scope of rights of the claims.

INDUSTRIAL APPLICABILITY

The stretchable circuit board according to the present invention has wide industrial applicability in technical fields such as optics, electronics, adhesives, and in the medical field, such as a wearable device, a patch device, and a flexible display device.

The invention claimed is:

1. A stretchable circuit board, comprising:
a stretchable insulating layer configured to be stretched in a longitudinal direction; and
a wiring that is formed of a combination of: a metal wiring portion that forms a main portion of the wiring and an electrically conductive stretchable portion disposed ancillary to the metal wiring portion,
wherein the metal wiring portion is defined by a linear or curvilinear form that extends between and includes opposing ends of the metal wiring portion that are spaced apart in the longitudinal direction, and
wherein the stretchable insulating layer has a first surface and a second surface that opposes the first surface, the wiring is formed on the first surface and the second surface, and a bridging portion that extends between the wiring formed on the first surface of the stretchable insulating layer and the wiring formed on the second surface of the stretchable insulating layer is formed of the electrically conductive stretchable portion.

2. The stretchable circuit board according to claim 1, wherein the wiring is a meander wiring.

3. The stretchable circuit board according to claim 1, further comprising a pad portion,
wherein a connection portion between the wiring and the pad portion is formed of the electrically conductive stretchable portion disposed ancillary to the connection portion.

4. The stretchable circuit board according to claim 1, further comprising a pad portion,
wherein the pad portion includes a metal layer forming a main portion of the pad portion, and the electrically conductive stretchable portion disposed ancillary to the metal layer.

5. The stretchable circuit board according to claim 1, wherein the electrically conductive stretchable portion is formed by using a conductive composition or a liquid metal.

6. A stretchable circuit board, comprising:
a stretchable insulating layer;
a wiring that is formed of a combination of: a metal wiring portion that forms a main portion of the wiring and an electrically conductive stretchable portion disposed ancillary to the metal wiring portion; and
a pad portion,
wherein a connection portion between the wiring and the pad portion is formed of the conductive stretchable portion disposed ancillary to the connection portion, and
wherein the stretchable insulating layer has a first surface and a second surface that opposes the first surface, the wiring is formed on the first surface and the second surface, and a bridging portion that extends between the wiring formed on the first surface of the stretchable insulating layer and the wiring formed on the second surface of the stretchable insulating layer is formed of the electrically conductive stretchable portion.

7. A stretchable circuit board, comprising:
a stretchable insulating layer;
a wiring that is formed of a combination of: a metal wiring portion that forms a main portion of the wiring and an electrically conductive stretchable portion disposed ancillary to the metal wiring portion; and
a pad portion,
wherein the pad portion includes a metal layer forming a main portion of the pad portion, and the conductive stretchable portion disposed ancillary to the metal layer, and
wherein the stretchable insulating layer has a first surface and a second surface that opposes the first surface, the wiring is formed on the first surface and the second surface, and a bridging portion that extends between the wiring formed on the first surface of the stretchable insulating layer and the wiring formed on the second surface of the stretchable insulating layer is formed of the electrically conductive stretchable portion.

* * * * *